(12) United States Patent
Land et al.

(10) Patent No.: US 9,548,877 B2
(45) Date of Patent: Jan. 17, 2017

(54) DIGITAL COMMUNICATION SYSTEM

(71) Applicant: University of South Australia, Adelaide SA (AU)

(72) Inventors: Ingmar Rudiger Land, Adelaide (AU); Gottfried Lechner, Adelaide (AU); Alexander James Grant, Adelaide (AU); David Victor Lawrie Haley, Adelaide (AU)

(73) Assignee: University of South Australia, Adelaide SA (AU)

( * ) Notice: Subject to any disclaimer, the term of this patent is extended or adjusted under 35 U.S.C. 154(b) by 0 days.

(21) Appl. No.: 14/654,513

(22) PCT Filed: Dec. 20, 2013

(86) PCT No.: PCT/AU2013/001501
§ 371 (c)(1),
(2) Date: Jun. 19, 2015

(87) PCT Pub. No.: WO2014/094064
PCT Pub. Date: Jun. 26, 2014

(65) Prior Publication Data
US 2015/0333942 A1 Nov. 19, 2015

(30) Foreign Application Priority Data

Dec. 20, 2012 (AU) ................................ 2012905588

(51) Int. Cl.
*H04L 27/20* (2006.01)
*H04L 27/18* (2006.01)
(Continued)

(52) U.S. Cl.
CPC .......... *H04L 27/18* (2013.01); *H03M 13/1157* (2013.01); *H03M 13/1197* (2013.01);
(Continued)

(58) Field of Classification Search
CPC ........................... H04L 27/2003; H04L 27/18
(Continued)

(56) References Cited

U.S. PATENT DOCUMENTS

2010/0157901 A1* 6/2010 Sanderovitz et al. ........ 370/328

OTHER PUBLICATIONS

Xiao et al., "Irregular Repeat Continuous Phase Modulation", IEEE Communication Letters, Aug. 2005, vol. 9, No. 8, pp. 723-725.*
(Continued)

*Primary Examiner* — Kevin M Burd
(74) *Attorney, Agent, or Firm* — McDonnell Boehnen Hulbert & Bergoff LLP

(57) ABSTRACT

Methods and apparatus for use in communication systems using recursive modulation schemes with a Low Density Generator Matrix code (including an irregular repeat accumulate (IRA) code) are described that have reduced complexity and thus reduced cost compared to prior art systems. A communication system is described in which the transmitter concatenates a low density generator matrix code with an accumulator followed by a recursive modulator in order to eliminate the use of an interleaver, and in which the receiver combines the decoder for the accumulator and the soft demodulator into a single joint decoder in order reduce the number of components and complexity. Another variation is also described in which the transmitter is further simplified by eliminated the accumulator altogether, and in which the receiver is further simplified by replacing the joint decoder with a soft demodulator prior to the LDGM soft decoder.

18 Claims, 9 Drawing Sheets

(51) Int. Cl.
*H04B 10/516* (2013.01)
*H03M 13/00* (2006.01)
*H03M 13/29* (2006.01)
*H03M 13/37* (2006.01)
*H03M 13/11* (2006.01)
*H04L 1/00* (2006.01)

(52) U.S. Cl.
CPC ... *H03M 13/2909* (2013.01); *H03M 13/2957* (2013.01); *H03M 13/3784* (2013.01); *H03M 13/616* (2013.01); *H03M 13/6325* (2013.01); *H04B 10/516* (2013.01); *H04L 1/005* (2013.01); *H04L 1/0042* (2013.01); *H04L 1/0057* (2013.01); *H04L 1/0065* (2013.01); *H04L 27/2003* (2013.01); *H03M 13/6331* (2013.01)

(58) Field of Classification Search
USPC .................................................. 375/279, 259
See application file for complete search history.

(56) References Cited

OTHER PUBLICATIONS

Richardson et al., "The Capacity of Low-Density Parity-Check Codes Under Message-Passing Decoding," IEEE Transactions on Information Theory, vol. 47, No. 2, Feb. 2001, pp. 599-618.
Richardson et al., "Design of Capactiy-Approaching Irregular Low-Density Parity-Check Codes," IEEE Transactions on Information Theory, vol. 47, No. 2, Feb. 2001, pp. 619-637.
Laurent, Pierre A., Exact and Approximate Construction of Digital Phase Modulations by Superposition of Amplitude Modulated Pulses (AMP), IEEE Transactions on Communications, vol. Com-34, No. 2, Feb. 1986, pp. 150-160.
Jinn, et al., "Irregular Repeat-Accumulate Codes," in Proc. Int. Symp. on Turbo Codes & Rel. Topics, 2000, pp. 1-8.
Divsalar, et al., "Coding Theorems for 'Tubo-Like' Codes," in Proc. Allerton Conf. on Commun., Control and Computing, vol. 36, 1998, pp. 201-210.
Aulin, et al., "Continuation Phase Modulation—Part I: Full Response Signaling," IEEE Transactions on Communications, vol. Com-29, No. 3, Mar. 1981, pp. 196-209.
Aulin, et al., "Continuous Phase Modulation—Part II: Partial Response Signaling," IEEE Transactions on Communications, vol. Com-29, No. 3, Mar. 1981, pp. 210-225.
Xiao, et al., "Irregular Repeat Continous Phase Modulation," IEEE Communications Letters, vol. 9, No. 8, Aug. 2005, pp. 723-725.
Xiao, et al., "Design of Low Density Generator Matrix Codes for Continuous Phase Modulation," IEEE Globecom, 2005, pp. 1245-1249.
Bahl, et al., "Optimal Decoding of Linear codes for Minimizing Symbol Error Rate," IEEE Transactions on Information Theory, Mar. 1974, pp. 284-287.
Laot, et al., "Turbo Equalization: Adaptive Equalization and Channel Decoding Jointly Optimized," IEEE Journal on Selected Areas in Communications, vol. 19, No. 9, Sep. 2001, pp. 1744-1752.
Schlegel, et al., "Trellis and Turbo Coding," IEEE Press Series on Digital & Mobile Communication, 2004, 392 pages.
Bao et al., "Concatenated eIRA Codes for Tamed Frequency Modulation," IEEE Int. Conf. On Communications 2008, ICC'08; May 19-23, 2008, Beijing (CN) pp. 1886-1891, XP031265683.

* cited by examiner

DIGITAL COMMUNICATION SYSTEM

CROSS-REFERENCE TO RELATED APPLICATIONS

The present application is a U.S. National Phase Application pursuant to 35 U.S.C. §371 of International Application No. PCT/AU2013/001501 filed Dec. 20, 2013, which claims priority to Australian Provisional Patent Application No. 2012905588 filed Dec. 20, 2012. The entire disclosure contents of these applications are herewith incorporated by reference into the present application.

INCORPORATION BY REFERENCE

Co-pending PCT Patent Application (number yet to be assigned) titled "Carrier phase and amplitude estimation for phase shift keying using pilots and data" filed on 13 Dec. 2013 is referred to in the following description, the content of which is hereby incorporated by reference in its entirety.

The following co-pending PCT applications are referred to in the following description:

PCT/AU2013/000888 titled "System and Method for Analog to Digital Conversion" filed on 13 Aug. 2013;

PCT/AU2013/000895 titled "Channel Allocation in a Communication System" filed on 14 Aug. 2013;

PCT/AU2013/001078 titled "Communication system and method" filed on 20 Sep. 2013; and PCT/AU2013/001079 titled "Multi-Access Communication System" filed on 20 Sep. 2013.

The content of each of these applications is hereby incorporated by reference in their entirety.

TECHNICAL FIELD

The present invention relates to digital communication systems. In a particular form the present invention relates to digital communication systems using recursive modulation schemes.

BACKGROUND

Many digital modulation schemes in current use are memoryless, meaning that the modulated signal within a particular time interval (called the symbol duration), corresponding to a particular data bit or group of data bits, is independent of the modulated signal for all other symbol durations. Some well-known examples of memoryless modulation schemes include binary phase shift keying (BPSK), quaternary phase shift keying (QPSK), and quadrature amplitude modulation (QAM). In this context a modulation scheme refers to the modulation and corresponding demodulation protocols or methods which are implemented in modulators and demodulators.

In contrast, a modulation scheme with memory produces a modulated signal that depends not only on the current bit (or group of bits), but also on previous bits or groups of bits. In this case the modulators and demodulators include a memory or register for storing previously transmitted or received bits or symbols. One particular class of modulation schemes with memory (ie non-memoryless) are recursive modulation schemes. These are modulation schemes with memory, defined recursively. Recursive modulators are characterised by their use of feedback within the modulator structure, in which the modulator output depends not only on current and previous data bits, but also on previous modulator outputs (or more generally on previous values of internal state variables). Notable examples of recursive modulation schemes are differential modulation in which the data is modulated onto differences between successive symbols, and continuous phase modulation where a recursive modulator is used to ensure constant amplitude and continuous phase properties. For example in differential modulation a transmitted bit is obtained by binary (ie mod 2) addition of the previously transmitted bit and the bit to be transmitted (ie $y_i = y_{i-1} \oplus x_i$). Similarly on the receive (or decoding) side, the bit to be decoded is the binary addition of the received bit and the previously received bit (ie $x_i = y_i \oplus y_{i-1}$).

Differential modulation schemes, such as differential phase shift keying (DPSK), are an attractive choice for situations where the absolute phase of the received signal is unknown, or is difficult to recover. The data is modulated onto the phase difference between successive symbols, rather than an absolute phase. Note that all differential modulation schemes are recursive (that is their modulator includes a feedback loop).

Advantages of differential modulation schemes include that it is possible to implement a non-coherent demodulator that does not need to perform computationally expensive carrier phase recovery. This can greatly decrease the implementation complexity of the receiver. Another advantage is that only a modest change is required at the transmitter to achieve the differential modulation. Disadvantages of differential modulation include that a single symbol erasure can affect the subsequent symbol(s), since the demodulator needs to know the phase difference between adjacent symbols. A further disadvantage is a 3 dB loss in performance when non-coherent demodulation is used.

Many variations of differential modulation schemes are possible, by varying the set of possible phase changes, and by varying the mapping between bits and phase changes. Differential modulation schemes are used in a wide variety of wired, radio frequency wireless and optical wireless communication systems. Common examples include differential binary phase shift keying (DBPSK), differential quaternary phase shift keying (DQPSK), or other variants such as π/4 offset differential quaternary phase shift keying (π/4-DQPSK).

In many circumstances it may be desirable to use a continuous phase modulation scheme (CPM). CPM provides higher spectral efficiency compared to other modulation schemes such as Phase Shift Keying (PSK) and a constant modulus allows the use of lower cost amplifiers since less headroom needs to be supplied. However there are also disadvantages associated with CPM. These include a higher complexity demodulator and the potential for catastrophic error propagation. For example if one symbol is "erased" all subsequent symbols are also erased. CPM is used in a wide range of systems including cellular communications systems such as GSM, automatic identification system (AIS), satellite communications, and various others. One widely used version of CPM is Gaussian minimum shift keying (GMSK).

It is desirable to increase the reliability of digital communication systems by using forward error control coding. The general advantages include increased spectral efficiency, increased power efficiency, and greatly decreased bit error rate (BER) or word error rate of the decoded signal. Modern error control codes such as turbo codes or low density parity check codes can offer performance that approach fundamental limits set by information theory.

One modern code which offers very good performance and has several implementation advantages is the irregular repeat accumulate (IRA) code. These codes have a low-complexity encoder implementation and a low complexity iterative decoding algorithm. These codes can approach the Shannon capacity of many channels.

FIG. 1 is a functional block diagram for implementing an Irregular Repeat Accumulate (IRA) code 10 by an encoder module in a transmitter. As shown in FIG. 1, an IRA code consists of the serial concatenation of an irregular repeat code encoder module 1, an interleaver module 2, a parity check module 3 and an accumulator module 5. As shown in FIG. 1, the IRA encoder receives a plurality of source bits $u=(u_1 \ldots, u_k)$ 6 and generates a plurality of encoded bits $x=(x_1, \ldots, x_n)$ 9. The combination of the irregular repeat code, interleaver and irregular parity checks can be viewed without loss of generality as a low density generator matrix (LDGM) code 4. By itself however, an LDGM code offers poor performance due to the existence of very low weight code-words. Concatenation of the outer LDGM encoder with a non-recursive inner code replacing the accumulator would also give very poor performance.

The key to the high performance of the IRA code 10 is the recursive nature of the accumulator 5 which combines 7 adjacent coded symbols (or encoded bits) d 8 to generate encoded bits x 9 for transmission. This ensures convergence of an iterative decoder which passes soft information between two component decoders (a) the LDGM decoder and (b) the accumulator decoder. The output of an irregular repeat accumulate code could be used to modulate the baseband channel input, using any suitable modulation scheme such as PSK, PAM, QAM, DPSK, DQPSK or CPM. However, if recursive (ie non-memoryless) modulation schemes are used (eg DPSK, DQPSK or CPM), it is standard practice to insert an additional interleaver 11 at the output of the accumulator 5 and prior to the modulator 12. This is shown in FIG. 2.

The additional interleaver 11 is required to ensure convergence of a decoder 20 that now iterates, passing soft information between three component decoders: (a) the variable node decoder 18; (b) the check node/accumulator decoder 16; and (c) a soft demodulator 14. This decoder structure is shown in FIG. 2 which is a functional block diagram of a transmitter and receiver for encoding and decoding an IRA code with recursive modulation. The addition of the interleaver 11 adds to the complexity and cost of the transmitter and receiver (which is required to include a corresponding de-interleaver, marked as blocks 15 and 17 in FIG. 2) in such systems. An additional consideration with this decoder structure is the order of activation of the three different component decoders. This adds to the complexity of the decoder, and may require additional control logic in order to optimise the order of activation. Alternatively, a fixed activation schedule could be used at the expense of decreased performance.

These requirements add additional cost and complexity and thus there is a need to develop coding methods and apparatus for systems using LDGM codes with recursive modulation schemes that are simpler and cheaper to implement, or to at least provide a useful alternative to existing methods and apparatus.

SUMMARY

According to a first aspect, there is provided an apparatus for generating a signal for transmission in a communication system using a recursive modulation scheme and a Low Density Generator Matrix (LDGM) code, the apparatus comprising:

an encoder for receiving a plurality of source bits and generating a plurality of coded symbols, wherein the encoder includes a Low Density Generator Matrix (LDGM) encoder to generate a plurality of coded symbols according to a LDGM code; and a recursive modulator which receives the plurality of coded symbols from the encoder and modulates the received plurality of coded symbols to a signal for transmission using a recursive modulation scheme.

In a further form, the encoder is an irregular repeat accumulate code encoder comprising the LDGM code (serially) concatenated with an accumulator and the plurality of coded symbols are encoded according to an IRA code. The recursive modulator may use a differential encoding modulation scheme or a continuous phase modulation scheme. The recursive modulator may use a finite state machine implementation.

According to a second aspect, there is provided an apparatus for receiving a transmission in a communication system using a recursive modulation scheme and a Low Density Generator Matrix (LDGM) code, the apparatus comprising:

a soft demodulator for receiving a transmit signal and demodulating the received signal according to a recursive modulation scheme to generate a plurality of coded symbol estimates; and a Low Density Generator Matrix (LDGM) decoder for receiving the plurality of coded symbol estimates from the soft demodulator and decoding the coded symbol estimates to generate a plurality Of source bit estimates.

The coded symbol estimates and source bit estimates may be hard or soft estimates. In a further form, iterative decoding of the received signal is implemented between the soft demodulator and the LDGM encoder until a stopping criterion is reached. Each iteration comprises two steps. In the first step the soft demodulator receives a plurality of soft a-priori estimates of the coded symbol estimates from the LDGM decoder, and generates updated coded symbol estimates which are transmitted to the LDGM decoder. In the second step the LDGM decoder receives a plurality of soft a-priori symbol estimates from the soft demodulator and generates updated coded symbol estimates which are transmitted to the soft demodulator for use as soft a-priori coded symbol estimates in the next iteration.

In a further form, the soft demodulator further comprises an accumulator decoder (ie jointly performs, decoding of the recursive modulation and accumulator steps on the transmit side). In one form, the communication system is a multi-access system and the soft demodulator further generates a soft estimate of the transmitted signal. In another form, the soft demodulator implements a differential demodulation scheme. In another form, the soft demodulator, implements a continuous phase demodulation scheme. The soft demodulator may use a trellis based algorithm. In one form, the soft demodulator correlates the received signal with all possible transmitted waveforms over a symbol period in which the set of all possible transmitted waveforms is determined using the recursive modulation scheme implemented.

A communication system comprising a transmitter of the first aspect and a receiver of the second aspect may also be provided.

According to a third aspect, there is provided a method for generating a signal for transmission in a communication system using a recursive modulation scheme and a Low Density Generator Matrix (LDGM) code, the method comprising:

encoding a plurality of received source bits and generating a plurality of coded symbols, wherein the encoder includes Low Density Generator Matrix (LDGM) encoder to generate a plurality of coded symbols according to a LDGM code; and modulating the plurality of coded symbols using a recursive modulation scheme to generate a signal for transmission.

According to a fourth aspect, there is provided a method for receiving a transmission in a communication system using a recursive modulation scheme and a Low Density Generator Matrix (LDGM) code, the method comprising:

soft demodulating a received transmit signal according to a recursive modulation scheme to generate a plurality of coded symbol estimates; and decoding the plurality of coded symbol estimates using a Low Density Generator Matrix (LDGM) decoding scheme and generating a plurality of source bit estimates.

BRIEF DESCRIPTION OF DRAWINGS

A preferred embodiment of the present invention will be discussed with reference to the accompanying drawings wherein.

In the following description, like reference characters designate like or corresponding parts throughout the figures.

DESCRIPTION OF EMBODIMENTS

Figure 1:
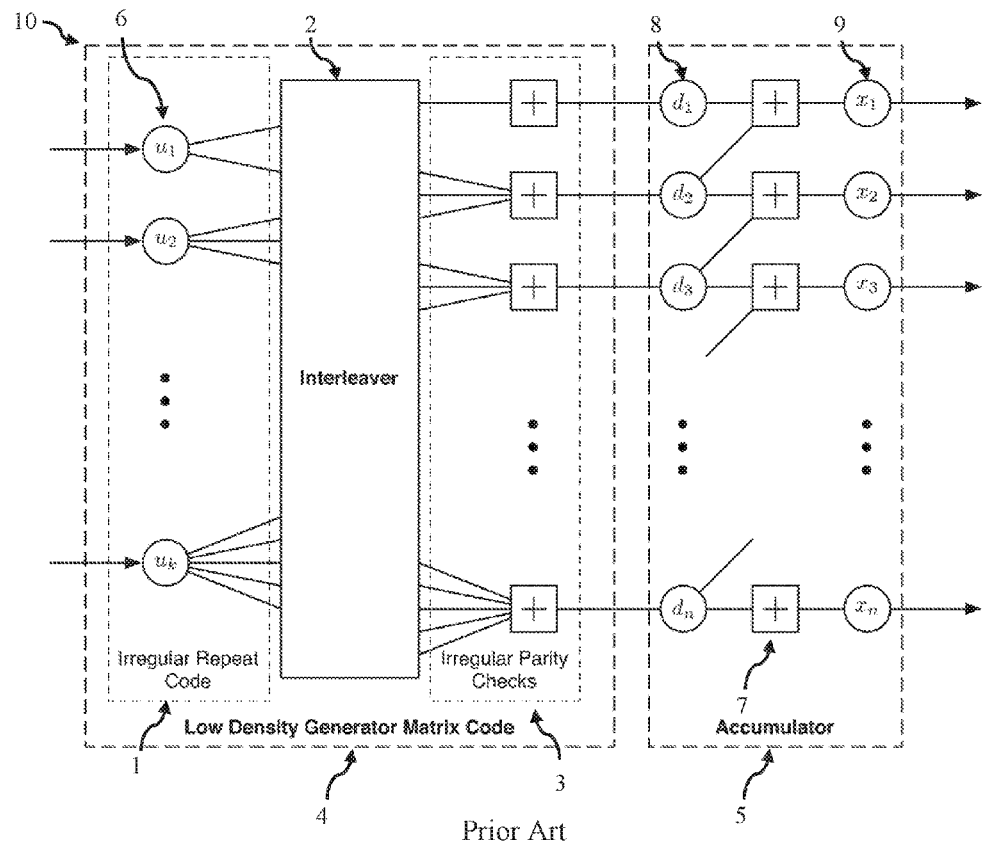
FIG. 1 is functional block diagram for implementing an Irregular Repeat Accumulate (IRA) coding scheme.
Figure 2:
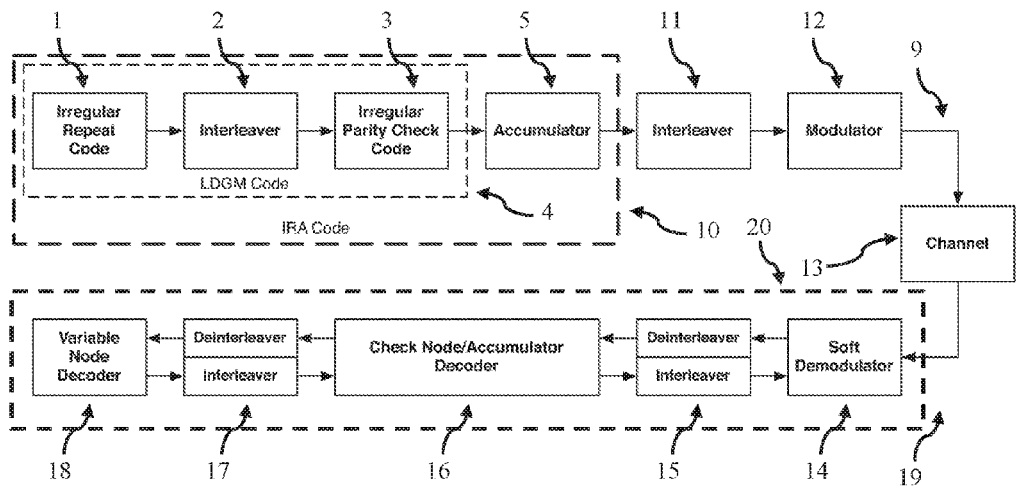
FIG. 2 is a functional block diagram of a transmitter and receiver for encoding and decoding an IRA code with a recursive modulation scheme.

Various embodiments of methods, apparatus and systems for generating and decoding signals using a low density generator matrix (LDGM) code (including IRA code) with a recursive modulation (ie non-memoryless) scheme will now be described. These embodiments avoid the standard requirement for interleavers 11 and 15 between the encoders and decoders and a three component decoder, and thus have reduced complexity and cost compared to existing systems which use an irregular repeat accumulate (IRA) code with a recursive modulation scheme such as those shown in the Prior Art system illustrated in FIGS. 1 and 2.

Figure 3:
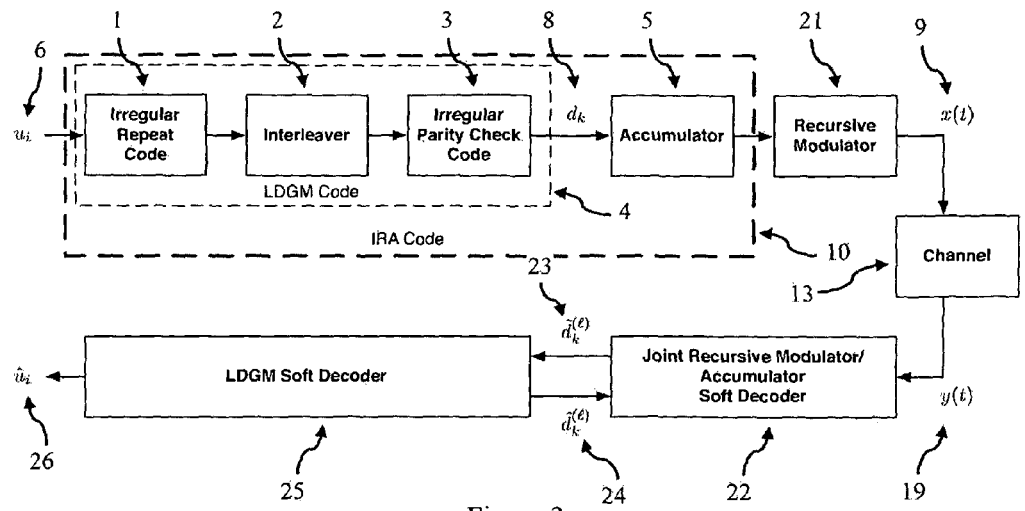
FIG. 3 is a functional block diagram of a transmitter and receiver for encoding and decoding an IRA code with a recursive modulation scheme according to an embodiment.

In one embodiment, a system using a combined accumulator and recursive modulator has been developed. A functional block diagram of a transmitter and receiver for encoding and decoding an IRA code with recursive modulation is illustrated in FIG. 3. In this embodiment, the transmitter comprises a LDGM encoder module 4, followed by an accumulator module 5 to form an IRA encoder 10, and this is concatenated or serially connected with a recursive modulator 21. The receiver comprises a joint recursive modulator/accumulator soft decoder 22 (joint accumulator decoder and recursive demodulator, or more concisely a joint decoder) and a LDGM soft decoder 25. In comparison with the prior art system illustrated in FIG. 2, no interleaver is used between the accumulator 5 and recursive modulator 21, and decoding is accomplished by iterating between two components: (a) the LDGM (soft) decoder 25 and (b) a joint (soft) decoder 22 for the accumulator/modulator. By eliminating the additional interleaver 11 on the transmit side, and by combining the decoder for the accumulator 16 and the soft demodulator 14 in the receiver into a single joint decoder (ie 22 replaces 14 and 16, and there is no need for interleaver 15) the number of components and thus complexity can be reduced.

As illustrated in FIG. 3, the encoder receives a plurality of source bits u 6 and generates a plurality of coded symbols (or encoded bits) d 8 according to an LDGM or, after an accumulator stage, an IRA code. The recursive modulator 21 and associated transmitter hardware (not shown) is used to generate a signal for transmission x(t) 9, which is transmitted over a (noisy) channel 13 to a receiver. The signal is attenuated/distorted by the channel and so the receiver thus sees a signal y(t) 19. The received signal 19 is passed to the joint decoder 22 where iterative decoding with the LDGM decoder 25 is performed. At iteration 1, the joint decoder 22 for the recursive modulator/accumulator takes as input the received signal y(t) 19 and a plurality of initial values (or prior values) of $\hat{d}_k^{(l)}$ 24 (at l=0 these are initialised to zero, ie uniform priors on the code bits) and computes soft bits $\tilde{d}_k^{(l)}$ 23. This joint decoder 22 can be implemented using a special form of the forward-backward algorithm operating on a joint trellis for the accumulator 5 and recursive modulator 21. In use the encoder will be provided with a stream (ie a plurality) of source bits 6 and generate a signal for transmission x(t) which is transmitted 9 and then decoded to generate an output stream (ie a plurality) of estimates of the source bits 26.

An example for use with a GMSK (ie CPM recursive modulation) scheme is discussed below, along with an example of a joint trellis for DBPSK. Starting from the GMSK example, generalisation to other forms of CPM is straightforward. Similarly, it is straightforward to apply the same method to operate on the expanded trellis resulting from differential modulation (eg DBPSK, DQPSK or π/4-DQPSK) and the accumulator. Such an expanded trellis structure can also be applied when additional non-memoryless line codes such as non-return-to-zero (NRZ) or non-return-to-zero-inverted (NRZI) are used. The soft bits $\tilde{d}_k^{(l)}$ 23 are passed to the LDGM soft decoder (discussed below) which then updates its soft bit estimates $\tilde{d}_k^{(l+1)}$ 24. This iterative process continues until a stopping criteria is reached. At this point the decoder can output final estimates of the original plurality of information bits, $\hat{u}_i$ 26.

Figure 4:
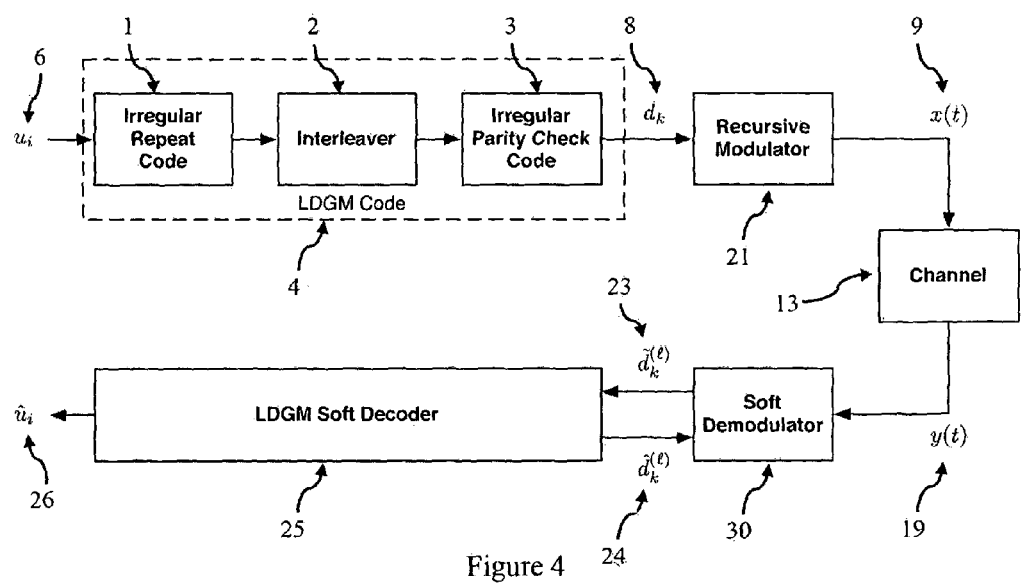
FIG. 4 is a functional block diagram of a transmitter and receiver for encoding and decoding a Low Density Generator Matrix (LDGM) code with a recursive modulation scheme according to one embodiment.

In a further embodiment, it was further realised that a recursive modulator 21 can fulfil the requirement for an inner recursive code, and thus the accumulator of the IRA encoder 5 can be replaced with any recursive modulator. That is the transmitter can be further simplified by eliminating the accumulator altogether and replacing it with a recursive modulator 21. A functional block diagram of a transmitter and receiver for encoding and decoding a Low Density Generator Matrix (LDGM) code with recursive modulation according to this embodiment is illustrated in FIG. 4. As illustrated in FIG. 4, the transmitter comprises a serial concatenation of a LDGM encoder 4 directly with a recursive modulator 21 (eliminating the standard accumulator 5, interleaver 11, and modulator 12 with a recursive modulator of prior art systems). This yields a convenient, low complexity encoder/modulator structure that can be iteratively demodulated/decoded by a receiver. Similarly the receiver is simplified as only a soft demodulator 30 is required prior to the LDGM soft decoder 25 (compare FIG. 4 with FIGS. 2 and 3).

Iterative decoding proceeds as described above, replacing the soft decoder for the joint recursive modulator/accumulator 22 with a soft decoder for the recursive modulator 30 alone. An example for use with a GMSK (ie CPM recursive modulation) scheme is described below. Starting from the GMSK example, generalisation to other forms of CPM is straightforward. The soft decoder for differential modulation (eg DBPSK, DQPSK or π/4-DQPSK) works in a similar fashion, operating on the trellis defined by the differential modulation scheme in use (see below for examples of these trellises).

Figure 5:
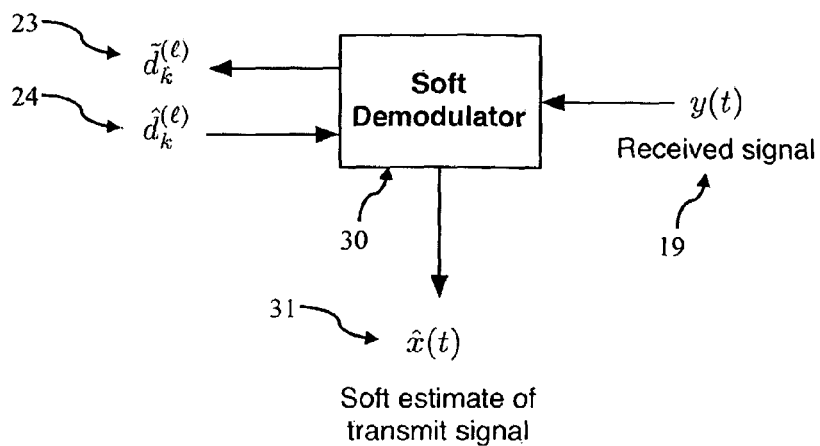
FIG. 5 is a functional block diagram of a soft demodulator for generation of soft estimate of a transmitted signal according to an embodiment.

In some cases, the decoder/demodulator is itself a component of a larger system. For example it may be used in a multiple access system consisting of many users, each independently transmitting encoded and modulated data. In such scenarios, it is also desirable to obtain, in addition to the decoded bits, a soft estimate of the transmitted signal 31 from the soft demodulator as is illustrated in FIG. 5. This can then be used to (iteratively) cancel interference to improve the performance of other users. Another application is turbo equalisation. A signal reconstruction could be achieved by taking a hard decision on the source bits and remodulating the result. However, there are several problems with this approach. Firstly, if the decoded bit error rate is poor, we end up with a very bad estimate of the transmitted signal, which can increase, rather than decrease the amount of interference in an iterative interference cancellation application. Secondly, with recursive modulation such as differential modulation or CPM, a single bit error or erasure can lead to a completely incorrect signal estimate following that bit. Again, this catastrophically increases interference in a cancellation receiver. The methods and system described herein can also be further adapted to address these problems by reconstructing a soft signal estimate using all available information from the improved decoder described herein.

FIG. 5 is a functional block diagram of a soft demodulator 30 for generation of soft estimate of a transmitted signal 31 according to an embodiment. This soft demodulator 30 may be used to replace the soft demodulators shown in either FIG. 3 or 4 (ie to additionally produce a soft estimate of the transmitted signal 31). The soft estimate is obtained by using all of the available information, namely the current values of the soft bits $\hat{d}_k^{(l)}$ 24 received from the LDGM decoder as well as the received signal y(t) 19. Again, an example for use with a GMSK (ie CPM recursive modulation) scheme is discussed below, and extension to other types of CPM is straightforward. The soft remodulator for differential modulation is described below.

Figure 6:
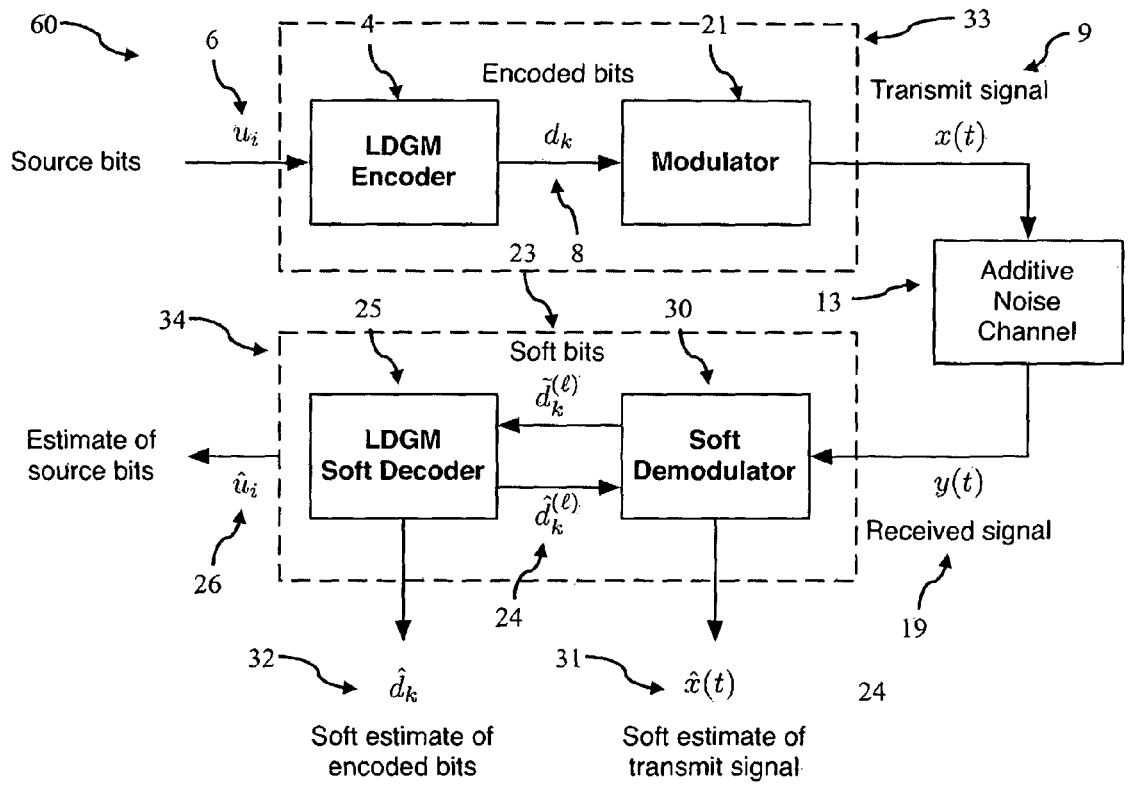
FIG. 6 is a functional block diagram of a transmitter and iterative receiver for encoding and decoding a Low Density Generator Matrix (LDGM) code with a recursive modulation scheme according to one embodiment.

FIG. 6 is a functional block diagram of a transmitter 33 and iterative receiver 34 for encoding and decoding a Low Density Generator Matrix (LDGM) code with recursive modulation according to one embodiment. FIG. 6 thus generalises the embodiments illustrated in FIGS. 3, 4 and 5. The transmitter consists of a serial concatenation of a low-density generator matrix encoder 4 and either (a) an accumulator 5 followed by a recursive modulator 21 (as illustrated in FIG. 3) or (b) just a recursive modulator 21 (as illustrated in FIG. 4). The soft demodulator 30 is also configured to additionally produce a soft estimate of the transmitted signal 31.

A detailed embodiment in which the recursive modulator 21 is a Gaussian minimum shift keying (GMSK) modulator (ie an example of a CPM modulation scheme) will now be described. We first describe the LDGM encoder/decoder 4/25, followed by the details of the GMSK modulator and demodulator. The iterative decoder exchanges soft information 23, 24, between component decoders for the combined accumulator/GMSK (or GMSK alone) and for the LDGM code. Given the examples below, implementations for other systems where the GMSK components are replaced with any other form of recursive modulation may be readily derived by those skilled in the art. Further embodiments in which the GMSK modulator (and corresponding demodulator) in FIG. 6 is replaced by a differential modulator for implementing differential binary phase shift keying (DBPSK), differential quaternary phase shift keying (DQPSK), or some other variant such as π/4 offset differential quaternary phase shift keying (π/4-DQPSK) will then be discussed.

We firstly consider the LDGM Encoder 4. It is noted that omitting the accumulator stage 5 from a non-systematic irregular repeat accumulate code results in a non-systematic irregular repeat/irregular parity check code. This is completely equivalent to a linear code with a k×n low density generator matrix G (ie a LDGM code). Let u=(u$_1$, . . . , u$_k$) be the k information bits arranged in a length k row vector. Then the corresponding code-word of n bits, arranged as a length n row vector $v=(v_1, \ldots, v_n)$ is obtained via the matrix-vector multiplication $v=uG$. The binary matrix G is sparse, having a relatively low density of ones compared to zeros. The Hamming weight $l_i$ of row $i=1, 3, \ldots, k$ corresponds to the number of times bit $u_i$ is repeated. The positions of the ones in row i determine the interleaving applied to bit i. Similarly, the Hamming weight $r_j$ of column $j=1, 2, \ldots, n$ is the number of bits participating in parity check j. Since G is sparse, the vector-matrix multiplication can be implemented with low complexity by a person skilled in the art.

Each code bit $v_i \in \{0,1\}$ is mapped to an antipodal signal $d_i \in \{-1,+1\}$, eg via $0 \mapsto +1$, $1 \mapsto -1$. Alternatively, groups of bits may be mapped onto higher order symbols (eg QPSK or 8PSK). Different choices exist for these mapping, including Gray mapping, natural mapping, and the mappings described below in relation to differential modulation. Whilst any mapping may be used, the performance of the system will vary based upon the choice of mapping.

The LDGM code is decoded on the factor graph of the code defined by the generator matrix. G, consisting of variable nodes for the information bits, variable nodes for the code bits, and check nodes. With reference to FIG. 6, the inputs to the decoder are a-priori log likelihood values (L-values) of the code bits, $\tilde{d}_k$, $k=1, 2, \ldots, n$, and the outputs are the extrinsic L-values of the code bits, $\hat{d}_k$, $k=1, 2, \ldots, n$. After a certain number of iterations or after a stopping criterion is fulfilled, the a-posteriori L-values of the information bits are computed, and based on that, the estimates of the source bits, $\hat{u}_i$, $i=1, 3, \ldots, k$, are determined. Suitable stopping criterion may be based on a percentage change in one or more parameters (eg estimates of the source bits or L-values) indicating a stable estimate has been reached, or a threshold level being reached. For example if one, a percentage (eg 50%, 75%, 90%) or all of the posteriori L-values meeting/passing a threshold value. Any message passing algorithm may be applied to perform the computation. Suitable examples include the sum-product algorithm, min-sum algorithm, or even binary-message passing algorithms as would be known to the person skilled in the art. They may also be based upon a hard decision estimate.

In this embodiment, the modulator is a GMSK modulator. The GMSK modulator maps the sequence of binary symbols $d_n \in \{-1,+1\}$, $n=0, 1, \ldots, N-1$, to the continuous phase signal $x(t)$. The modulation parameters are: symbol duration T, 3 dB bandwidth B (or equivalently the product BT), pulse length L symbols (ie, pulse duration LT), and transmit energy $E_s$ per symbol.

The GMSK signal can be derived as follows. For $t \in [0, (N+L)T)$, the complex baseband signal is $$x(t) = \sqrt{\frac{E_s}{T}} e^{j\varphi(t)} \tag{1}$$

with the information-bearing phase $$\varphi(t) = \varphi_0 + \pi \sum_{n=0}^{N-1} d_n \cdot q(t - nT), \tag{2}$$

where $\phi_0$ is a constant phase offset and q(t) is the causal GMSK phase pulse (see below). Notice that $\int_0^T \|e^{j\varphi(t)}\|^2 dt = T$. The GMSK phase pulse has the properties $$q(t) = \begin{cases} 0 & \text{for } t \leq 0 \\ \text{monotonically increasing} & \text{for } 0 \leq t \leq LT \\ 1/2 & \text{for } LT < t \end{cases} \tag{3}$$

To define the GMSK, consider first the time-symmetric non-truncated phase pulse $q_0(t)$ and the corresponding frequency pulse $q'_0(t)$. The phase pulse $q_0(t)$ is defined as the integral of the frequency pulse $q'_0(t)$, $$q_0(t) = \int_{-\infty}^{t} q'_0(\tau) d\tau; \tag{4}$$

the frequency pulse is defined as the convolution of the rectangular MSK pulse r(t) with a Gauss pulse g(t), $$q'_0(t) = r(t) * g(t), \tag{5}$$

where $$r(t) = \begin{cases} \frac{1}{2T} & \text{for } -\frac{T}{2} \leq t \leq \frac{T}{2} \\ 0 & \text{otherwise} \end{cases} \tag{6}$$

$$g(t) = \frac{1}{\sqrt{2\pi}\,\sigma_g} e^{-\frac{t^2}{2\sigma_g^2}}, \quad \sigma_g = \frac{T\sqrt{\ln 2}}{2\pi BT}. \tag{7}$$

The pulses can be expressed analytically using g(t) and Q(x):

$$q'_0(t) = \frac{1}{2T}\left[Q\left(\frac{t-T/2}{\sigma_g}\right) - Q\left(\frac{t+T/2}{\sigma_g}\right)\right] \tag{8}$$

$$q_0(t) = \frac{1}{2} + \frac{\sigma_g^2}{2T}[g(t+T/2) - g(t-T/2)] + \frac{t-T/2}{2T} \cdot Q\left(\frac{t-T/2}{\sigma_g}\right) - \frac{t+T/2}{2T} \cdot Q\left(\frac{t+T/2}{\sigma_g}\right). \tag{9}$$

where the Q-function is defined as $$Q(t) = \frac{1}{\sqrt{2\pi}} \int_t^{\infty} e^{-z^2/2} dz = \frac{1}{2}\text{erfc}(t/\sqrt{2}). \tag{10}$$

Truncating $q_0(t)$ at $-LT/2$ and $LT/2$ and shifting it by $LT/2$ gives the causal phase pulse q(t).

The GMSK modulator may be interpreted as a finite state machine. This description may be applied to implement the modulator and can be used to define the trellis in the soft-output decoding algorithm. Consider the phase for the time interval $t=kT+\tau$, $\tau \in [0,T)$, referred to as time k in the following, and split it up as follows:

$$\varphi(kT + \tau) = \varphi_0 + \pi \sum_{n=0}^{k} d_n \cdot q(\tau + (k-n)T) \tag{11}$$

$$= \varphi_0 + \frac{\pi}{2}\sum_{n=0}^{k-L} d_n + \pi \sum_{n=k-L+1}^{k} d_n \cdot q(\tau + (k-n)T)$$

$$= \varphi_0 + \theta_k + \pi \sum_{i=0}^{L-1} d_{k-i} \cdot q(\tau + iT),$$

-continued with $$\theta_k = \frac{\pi}{2}\sum_{n=0}^{k-L} d_n = \theta_{k-1} + \frac{\pi}{2}d_{k-L}. \quad (12)$$

The pulses associated to $d_n$, $n \leq k-L$, have reached their maximum value ½, and their contributions to the phase are gathered in $\theta_k$. Notice that $$\theta_k \in \left\{0, \frac{\pi}{2}, \pi, \frac{3\pi}{2}\right\}$$

and in particular $$\theta_k \in \begin{cases} \{0, \pi\} & \text{if } k \text{ is even} \\ \left\{\frac{\pi}{2}, \frac{3\pi}{2}\right\} & \text{if } k \text{ is odd} \end{cases} \quad (13)$$

As can be seen from (11), the phase in this time interval depends only on the state $$s_k = (\theta_k, \underbrace{d_{k-L+1}, d_{k-L+2}, \ldots, d_{k-2}, d_{k-1}}_{L-1 \text{ symbols}}) \quad (14)$$

and the current symbol $d_k$. The state space is given by $$S = \left\{0, \frac{\pi}{2}, \pi, \frac{3\pi}{2}\right\} \times \{-1, +1\}^{L-1}, \quad (15)$$

and has size $|S|=4 \cdot 2^{L-1}=2^{L+1}$. Note that the size of the state space can be reduced by a factor of 2 by considering (13).

Figure 7:
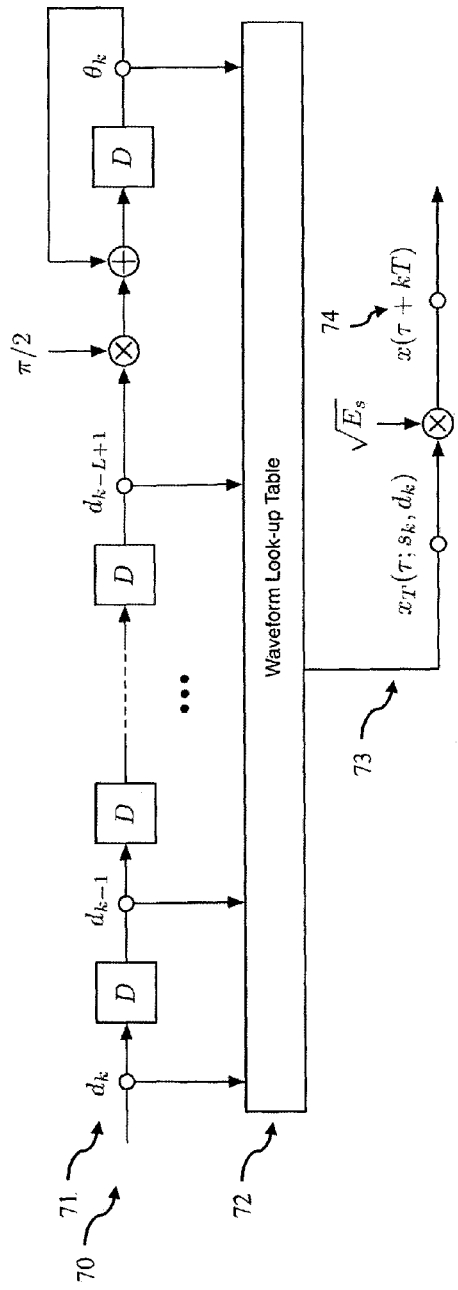
FIG. 7 is a finite state machine representation of a GMSK modulator according to an embodiment.

Thus we have a finite state machine representation 70 of the GMSK modulator, which is illustrated in FIG. 7. Define the initial state as $s_0=(\theta_0, d_{-L+1}, \ldots, d_{-1})$ with (the arbitrary choice of) $d_{-L+1}=d_{-L+2}=d_{-1}=-1$ and $\theta_0=0$. Also arbitrarily, we may choose the initial phase as $\phi_0=0$. We define the phase function for one symbol duration T as $$\varphi_T(\tau; s, d) = \varphi_0 + \theta + \pi \sum_{i=0}^{L-1} d'_{-i} \cdot q(\tau + iT), \tau \in [0, T) \quad (16)$$

for state $s=(\theta, d'_{-L+1}, \ldots, d'_{-1})$ and $d'_0=d_0$. Then for $t=kT+\tau$, $\tau \in [0,T)$, $$\phi(kT+\tau)=\phi_T(\tau;s_k,d_k). \quad (17)$$

Similarly, we define the normalised signal function (with unit energy) for one symbol duration T as $$x_T(\tau; s, d) = \frac{1}{\sqrt{T}} e^{j\varphi_T(\tau;s,d)}. \quad (18)$$

The set of all such signal functions is denoted by $$\mathcal{X} = \{x_T(\tau;s,d) : (s,d) \in \mathcal{S} \times \{-1,+1\}\}. \quad (19)$$

Then for $t=kT+\tau$, $\tau \in [0,T)$, $$x(kT+\tau)=\sqrt{E_s} \cdot x_T(\tau;s_k,d_k). \quad (20)$$

These relations are also illustrated in FIG. 7. The states 71 defined in (14) are shown in the top of the diagram and each state is provided to the waveform lookup table 72. The recursive nature of the GMSK modulator is apparent from the generation of states 71 in the top of FIG. 7, in which element D indicates a delay element (ie for one symbol duration) that is equivalently a memory that stores the previous state. The waveform lookup table stores the waveforms associated with each of the states given by (15) to obtain the output phase given by (17) from which the normalised signal function 73 can be obtained by (18). The normalised signal 73 is then multiplied by $\sqrt{E_s}$ to obtain the output signal 74 given by (20).

A GMSK Soft Demodulator can also be developed. The GMSK signal may be represented in a trellis with states, as defined above. The transition from current state $s_k$ with current input symbol $d_k$ to next state $s_{k+1}$ is given by $$s_k = (\theta_k, d_{k-L+1}, \ldots, d_{k-1}) \overset{d_k}{\to} s_{k+1} = (\theta_{k+1}, d_{k-L+2}, \ldots, d_k) \quad (21)$$

with $\theta_{k+1}=\theta_k+(\pi/2)d_{k-L+1}$. Thus, GMSK can be decoded on this trellis with the Viterbi algorithm, the BCJR algorithm, or any variations thereof in the standard way, where also a-priori soft-information (probabilities) of the input symbols may be used.

Generalisation to other memoryless channels is straightforward, and to channels with memory is possible. Assume transmission of the signal x(t) over an Additive White Gaussian Noise (AWGN) channel. The channel output is $$y(t)=x(t)+w(t), \quad (22)$$

where w(t) is a complex white Gaussian noise process with spectral power density $N_0$ ($N_0/2$ per dimension). The GMSK demodulator obtains the channel output y(t) and a-priori information $\hat{d}_k$ for each transmitted symbol $d_k$, $k=0, 1, \ldots, N+L$. Without loss of generality, we assume that this information is provided in terms of log-likelihood ratios (L-values), ie, $$\hat{d}_k := L(d_k) = \log\frac{P(d_k = +1)}{P(d_k = -1)}. \quad (23)$$

Using these input values, the GMSK demodulator computes the extrinsic L-values of the symbols $d_k$, $$\tilde{d}_k := L_e(d_k) = \log\frac{P(d_k = +1 \mid y(t), \hat{d}_0, \ldots, \hat{d}_{k-1}, \hat{d}_{k+1}, \ldots, \hat{d}_{N+L})}{P(d_k = -1 \mid y(t), \hat{d}_0, \ldots, \hat{d}_{k-1}, \hat{d}_{k+1}, \ldots, \hat{d}_{N+L})}, \quad (24)$$

$k=0, 1, \ldots, N+L$, using standard trellis-based algorithms, like BCJR, LogAPP, SOVA, etc. The branch metric to be used in these algorithms comprises the a-priori L-values and the log-likelihoods of the waveforms. The latter is considered in the following.

An optimal method of demodulation is to correlate the received signal with all possible transmitted waveforms for time intervals [kT,(k+1)T). This may be written using the real part of the inner product, $$b_k(\tilde{s},\tilde{d})= \Re\left\{\langle y(kT+\tau), x_T(\tau;\tilde{s},\tilde{d})\rangle\right\}, \quad (25)$$

where $(\tilde{s},\tilde{d}) \in \equiv \times \{-1,+1\}$ denotes the hypothesis and the inner product is defined as $$\langle x(t), y(t) \rangle = \int_0^T x(t) y^*(t) dt \qquad (26)$$

for signals confined to the interval $t \in [0,T)$ and $(.)^*$ denotes complex conjugation. We have for the signal and the noise part $$\langle x(t;\tilde{s},\tilde{d}), x_T(\tau;\tilde{s},\tilde{d}) \rangle = \sqrt{E_s}$$

$$\mathbb{E}\langle w(t), x_T(\tau;\tilde{s},\tilde{d}) \rangle = 0$$

$$\mathbb{E} |\langle w(\tau), x_T(\tau;\tilde{s},\tilde{d}) \rangle|^2 = N_0, \qquad (27)$$

and thus the log-likelihood is given by $$\log p(y(kT+\tau) | x_T(\tau; \tilde{s}, \tilde{d})) = 2\frac{E_s}{N_0} \cdot b_k(\tilde{s}, \tilde{d}) + c_0, \qquad (28)$$

where $c_0$ is a constant independent of the transmitted waveform, and can thus be ignored.

Combining this log-likelihood with the a-priori L-values for the symbols gives the desired additive branch metric $$\mu_k(\tilde{s}, \tilde{d}) := L(d_k) + 2\frac{E_s}{N_0} \cdot b_k(\tilde{s}, \tilde{d}). \qquad (29)$$

Alternatively, the branch metrics may be computed using the amplitude modulation (AM) representation of CPM signals. In another embodiment, demodulation is performed by correlating the received signal with a set of approximations of the transmitted waveforms. In one embodiment, this set of exact or approximate waveforms are linear combinations of pulse amplitude modulated (PAM) waveforms obtained from a Laurent decomposition of the CPM signal.

GMSK Soft Signal. Reconstruction can also be performed. The GMSK demodulator can also be used to reconstruct a soft signal estimate based on the noisy observation $y(t)$ of the signal $x(t)$ and the a-priori information $\hat{d}_k$ of the symbols $d_k$. In particular, we aim to compute the expectation $(\mathbb{E}[.])$ $$\hat{x}(t) = \mathbb{E}[x(t)|y(t), \hat{d}_0, \hat{d}_1, \ldots, \hat{d}_{N+L}]. \qquad (30)$$

This type of signal estimate is typically used in multi-user receivers for soft interference cancellation. Consider the estimate $\hat{x}(kT+\tau)$, $\tau \in [0,T)$, for one symbol period. We can compute the probability $$q_k(x_T(\tau)) = P(\hat{x}(kT+\tau) = x_T(\tau) | y(t), \hat{d}_0, \hat{d}_1, \ldots, \hat{d}_{N+L}) \qquad (31)$$

for each waveform $x_T(\tau) \in \chi$, cf. (19), and all $k=0, 1, \ldots, N+L$, on the GMSK trellis with a trellis-based algorithm, eg the BCJR LogAPP algorithm, SOVA, etc. The desired expectation is then given by the average:

$$\hat{x}(kT+\tau) = \sum_{x_T(\tau) \in X} q_k(x_T(\tau)) \cdot x_T(\tau), \qquad (32)$$

where $k=0, 1, \ldots, N+L$.

As was described above, and as was illustrated in FIG. 3, in one embodiment, a combined accumulator and recursive modulator may also be used to replace the accumulator/interleaves/modulator architecture of the prior art. As will be shown using a joint accumulator/GMSK modulator instead of the plain GMSK modulator described above implies only minor changes in the modulator and the demodulator.

Figure 8:
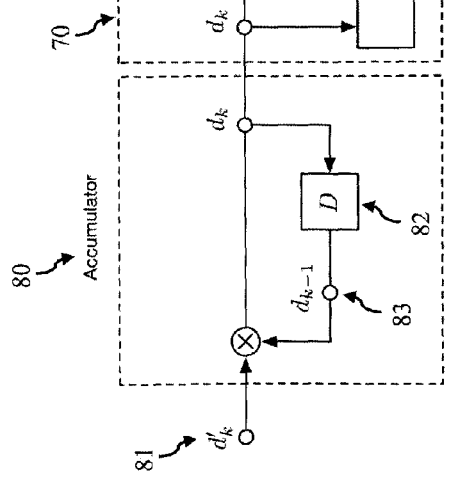
FIG. 8 is a finite state machine representation of a Joint Accumulator and GMSK Modulator according to an embodiment.

The joint modulator is obtained by precoding the GMSK modulator with an accumulator, or equivalently by a differential precoder, as illustrated in FIG. 8 which is a finite state machine representation 80 of a joint accumulator and GMSK modulator according to an embodiment.

For convenience, we keep the notation for the GMSK modulator, and denote the input to the accumulator by $d'_k$ 81. Though the accumulator seems to introduce a new delay element 82 and thus additional memory, it actually does not. The symbol $d_{k-1}$ 83 required for the accumulator operation $$d_k = d'_k \cdot d_{k-1} \qquad (33)$$

is already available in the memory of the GMSK modulator (note that in channel coding literature, the accumulator is usually described with symbols from $\{0,1\}$ and binary addition, which is equivalent to our description in which $0 \mapsto +1$, and $1 \mapsto -1$). Therefore, the trellis complexity of the combined accumulator/GMSK-modulator is actually exactly the same as the complexity of the GMSK modulator described above. Even more, the trellis of the combined accumulator/GMSK-modulator may easily be obtained by relabelling the GMSK-modulator by a person skilled in the art. The algorithms for demodulation and soft signal reconstruction are identical to those for the (plain) GMSK modulator, only the labels of the trellis transitions are different.

The above description provides an example of how to implement an LDGM code with reduced implementation complexity for use with continuous phase modulation schemes such as GMSK. This work will now be extended to consider differential modulation schemes such as differential binary phase shift keying (DBPSK). As was the case for CPM schemes, we will first consider the case in which the accumulator, interleaver and modulator are replaced directly with a recursive modulator 21.

Figure 9:
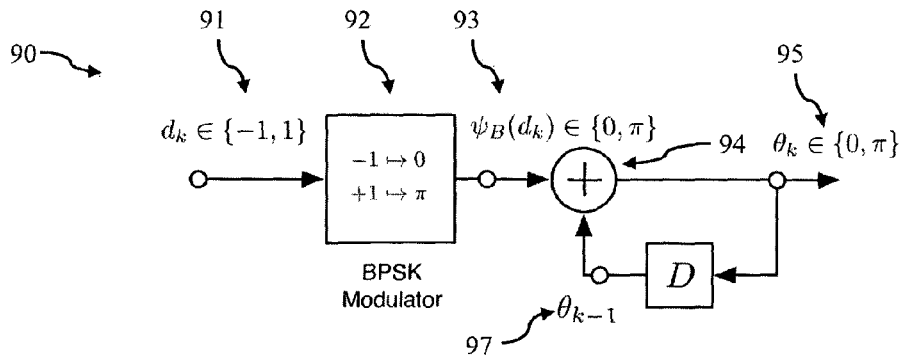
FIG. 9 is a finite state machine representation of a Differential Binary Phase Shift Keying (DBPSK) modulator according to an embodiment.

FIG. 9 is a finite state machine representation 90 of a Differential. Binary Phase Shift Keying (DBPSK) modulator according to an embodiment. At the input, binary symbols $d_k \in \{-1,1\}$ 91 are modulated 92 onto binary phases $\psi_B(d_k) \in \{0,\pi\}$ 93 (this is a BPSK modulator). The output signal $\theta_k$ 95, which is the phase to be transmitted at time k, is formed as $$\theta_k = \theta_{k-1} \oplus \psi(d_k), \qquad (34)$$

where the addition 94 of the previous phase 97 (obtained via delay element D or memory) is modulo $2\pi$ (ie wraps around at $2\pi$, so that $m2\pi + \theta \equiv \theta$ for integer m). Note that the structure of the DBPSK modulator is similar to that of the accumulator.

Figure 10:
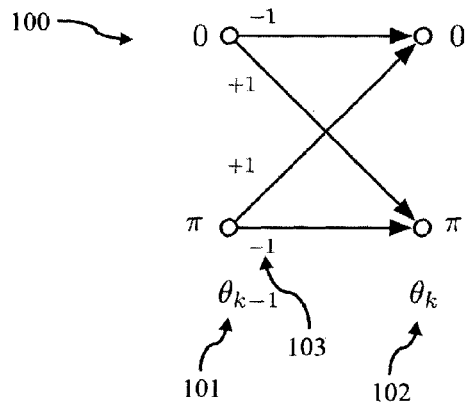
FIG. 10 is a trellis representation of DBPSK according to an embodiment.

It is common practice to represent a finite state machine using a trellis diagram. FIG. 10 shows the finite state machine 90 of the DBPSK modulator of FIG. 9 represented as a trellis 100. The states are labelled with the corresponding values of the previous phase $\theta_{k-1}$ 101 and current phase $\theta_k$ 102. The branch labels 103 are the values of the input $d_k$ which cause the corresponding state transitions.

Assuming rectangular pulse shaping (other pulse shapes can be easily incorporated), the transmitted signal for the interval of duration T corresponding to state s=$\theta$ and symbol d is $$x_T(\tau; s, d) = \frac{1}{\sqrt{T}} e^{j\varphi(\tau,s,d)}. \qquad (35)$$

where $$\varphi(\tau;\theta,d) = \theta \oplus \psi_B(d), \tau \in [0,T). \qquad (36)$$

Figure 11:
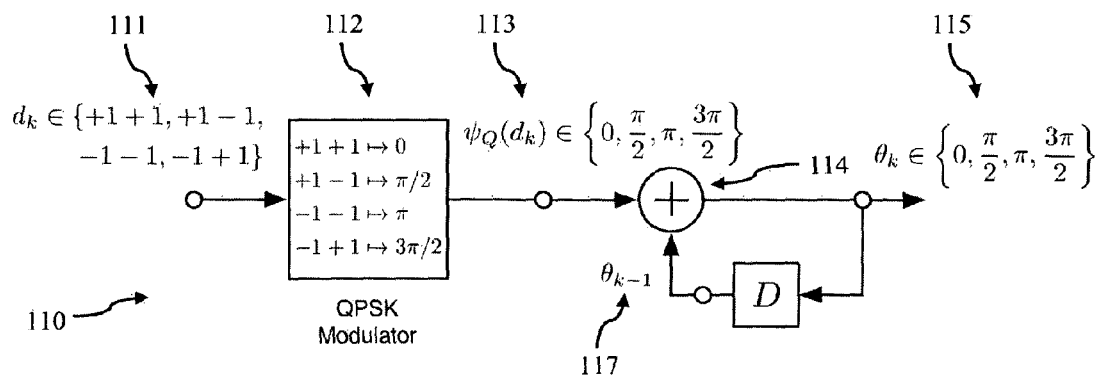
FIG. 11 is a finite state machine representation of a Differential Quaternary Phase Shift Keying (DQPSK) modulator according to an embodiment.
Figure 13:
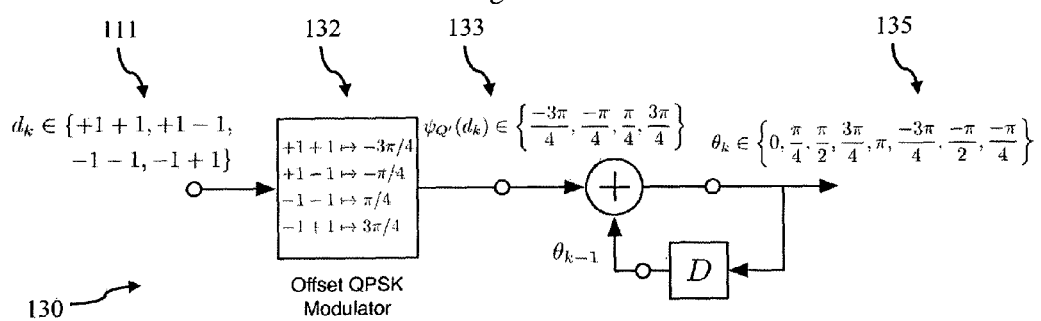
FIG. 13 is a finite state machine representation of a $\pi/4$ offset DBPSK modulator according to an embodiment.

Other common types of differential modulation are differential quaternary phase shift keying (DQPSK), a finite state machine representation 110 of which is shown in FIG. 11, and π/4 offset DQPSK, a finite state machine representation 130 of which is shown in FIG. 13. These differ in the set of phase shifts that are used to encode the two bits of data.

For DQPSK (FIG. 11), each pair of bits 111 is encoded 112 into a phase shift 113 from $0,\pi/2,\pi,3\pi/2$ with respect to the previous symbol. One possible mapping is shown in FIG. 11, other mappings are also possible. The input binary symbols are selected from $d_k \in \{00,01,11,10\} \equiv \{+1+1,+1-1,-1-1,-1+1\}$ (based upon $0 \mapsto +1$, and $1 \mapsto -1$). The possible output phases 115 are from the set $0,\pi/2,\pi,3\pi/2$. Again the output phase is obtained from the addition of the previous phase 117 with phase shift 113.

Figure 12:
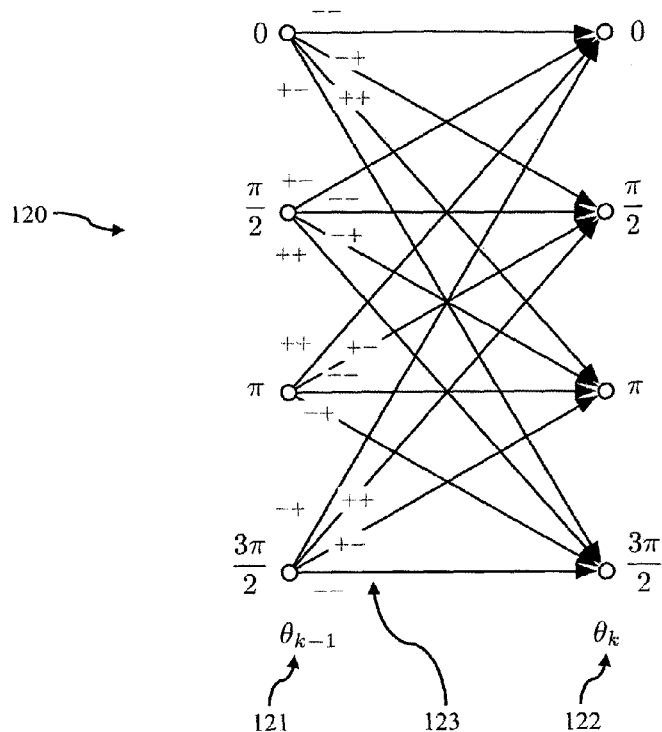
FIG. 12 is a trellis representation of DQPSK according to an embodiment.

The trellis representation 120 of DQPSK is shown in FIG. 12. The trellis shows the previous phase $\theta_{k-1}$ 121 and current phase $\theta_k$ 122, and now has four states and is fully connected. The branches are labelled 123 according to the value of the input $d_k$ causing that transition (with $-1$ abbreviated by $-$ and $+1$ abbreviated by $+$). The output signal is obtained in the same way as (35), (36) with $\psi_Q(d)$ replacing the BPSK modulator (according to FIG. 11).

Figure 14:
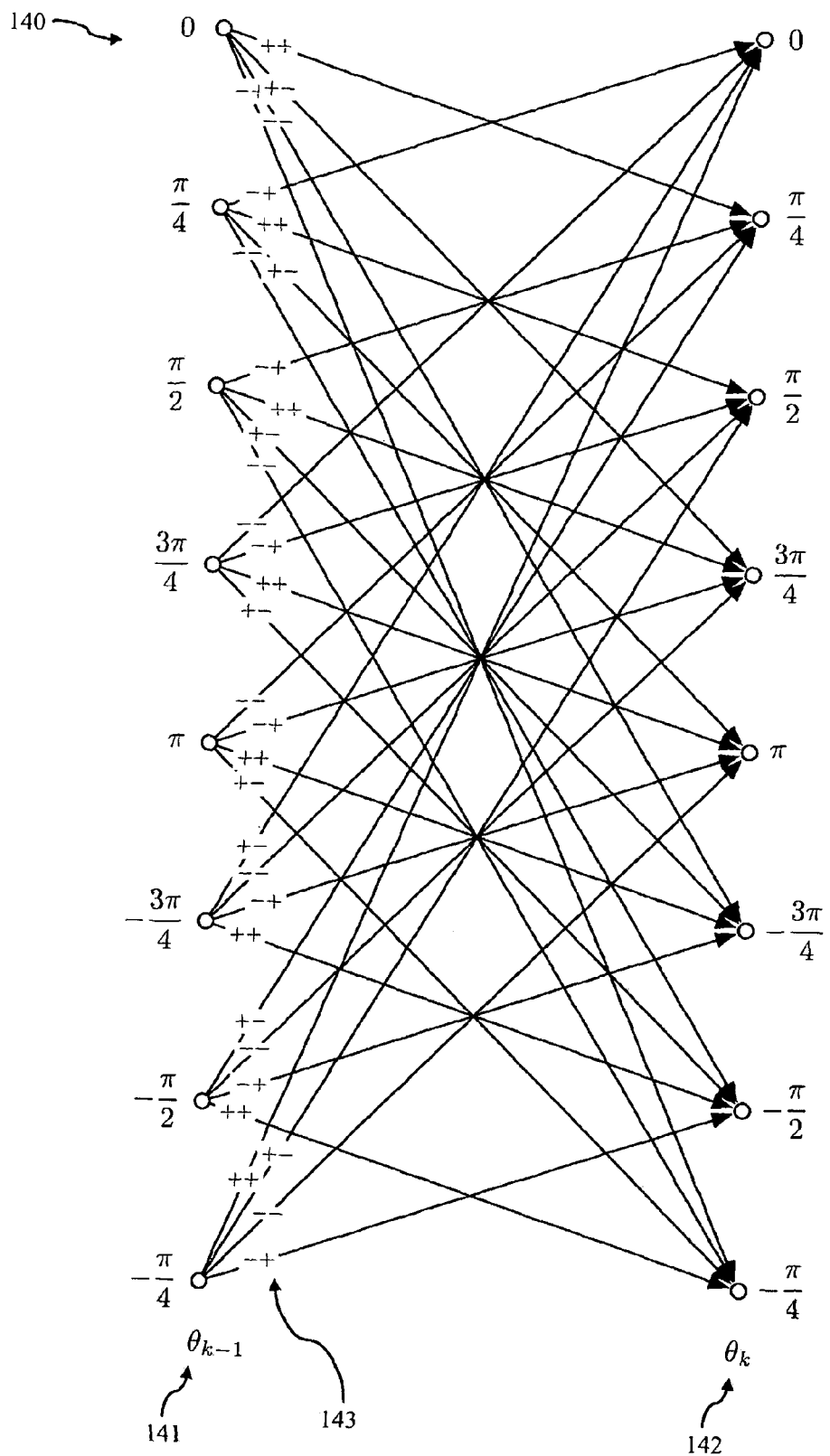
FIG. 14 is a trellis representation of $\pi/4$ offset DBPSK according to an embodiment.

For π/4 offset DQPSK (FIG. 13), the allowable phase shifts 133 are $\pm\pi/4,\pm3\pi/4$ (again, one example of mapping 132 is given in the figure, but others are possible). This is to avoid phase changes of π (ie sign changes), which can be undesirable. There are now eight possible output phases, $0,\pm\pi/4,\pi,\pm\pi/2,\pm3\pi/4$ 135, however, as shown in FIG. 14 which is the trellis diagram 140 of π/4 offset DBPSK, given any phase $\theta_{k-1}$ 141, the phase $\theta_k$ 142 is one of only four possibilities. If $\theta_{k-1} \in \{0,\pi/2,\pi,3\pi/2\}$, then $\theta_k \in \{\pm\pi/4,\pm3\pi/4\}$. If $\theta_{k-1} \in \{\pm\pi/4,\pm3\pi/4\}$ then $\theta_k \in \{0,\pi/2,\pi,3\pi/2\}$. Again, the branch labels 143 are the values of the input $d_k$ which cause the corresponding state transitions. The output signal is obtained in the same way as (35), (36) with $\psi_Q(d)$ replacing the BPSK modulator (according to FIG. 13).

Figure 15:
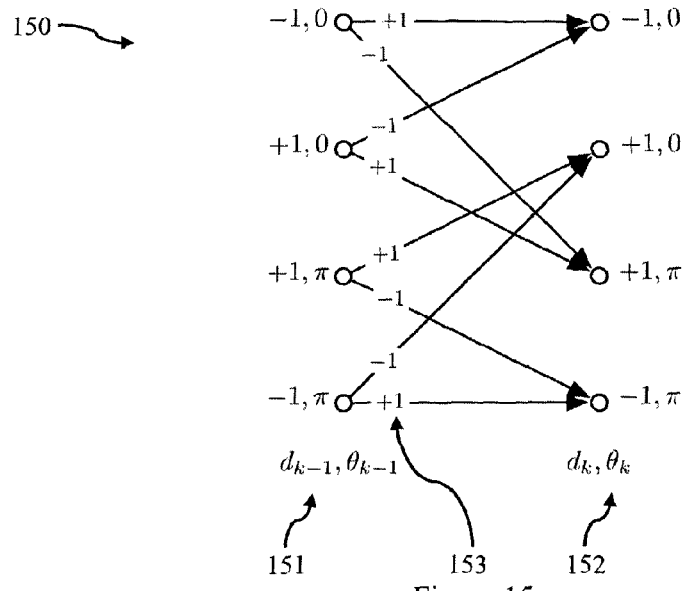
FIG. 15 is a trellis representation of a joint accumulator/DBPSK.

As was the case for CPM schemes, the above theory may be applied to an alternative embodiment in which the accumulator, interleaver and modulator are replaced with a joint accumulator and differential modulator. It is possible to make a joint trellis for the combination of the accumulator followed by differential modulation. FIG. 15 is a trellis representation 150 of a joint accumulator/DBPSK. The states are labelled with the pair $d_{k-1}, \theta_{k-1}$ (previous state) 151 and $d_k, \theta_k$ (current state) 152. The transitions are labelled 153 with the value of $d_k$ that causes the transition. From the diagram, we see that there are now four states (storing not only the previous data bit, but also the previous phase). However, there are only two possible transitions from each state (one for each value of $d_k$). Thus the overall complexity of implementing a soft decoder (eg BCJR and its variants) is the same as that for DBPSK alone. It is straightforward for someone skilled in the art to derive the corresponding joint trellises for other forms of differential modulation, such as DQPSK and π/4-DQPSK.

As was already described above in relation to CPM and GMSK, a soft demodulator for differential modulation can also be implemented using the well-known BCJR algorithm or any of its variants, such as LogAPP, SOVA etc. The computation of the branch metrics in this case follows the same principle as described in relation to the GMSK soft demodulator, where we use the appropriate definition of $x_T(\tau; s,d)$ for recursive modulation (ie equation (35) rather than equation (18)).

Similarly, soft signal reconstruction for differential modulation can be achieved using the method described in relation to GMSK soft signal reconstruction. We again replace the waveforms $x_T(\tau)$ with the appropriate definition in relation to recursive modulation.

Figure 16:
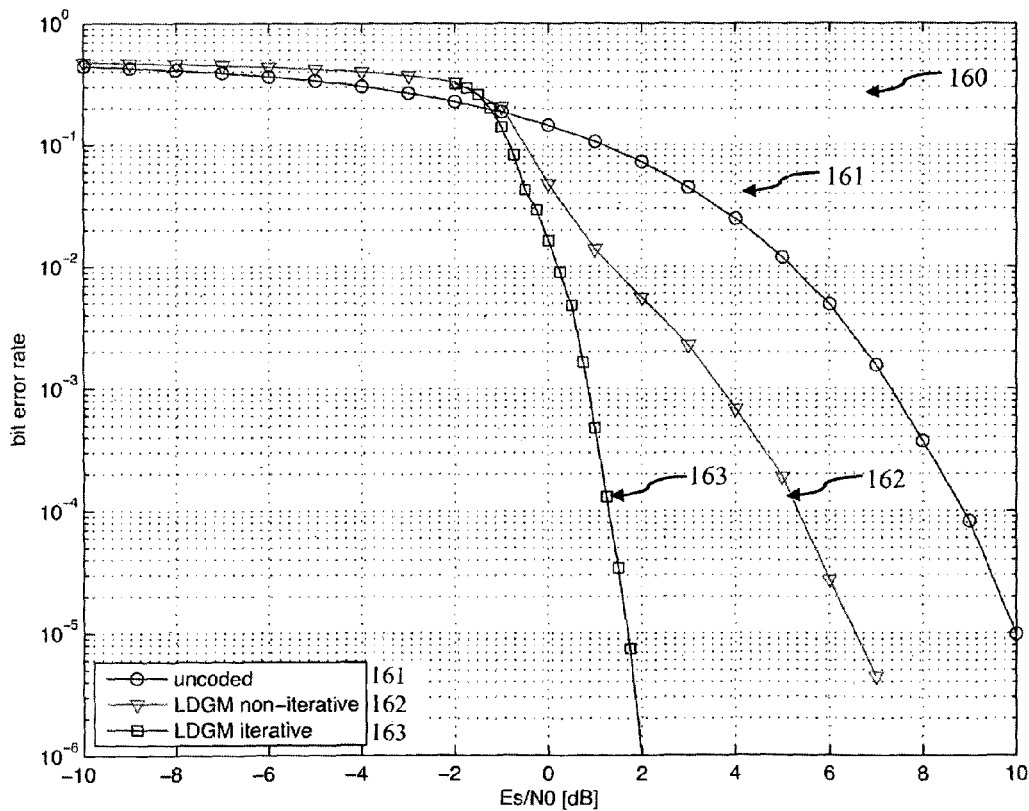
FIG. 16 is a figure comparing bit error rates for uncoded GMSK, LDGM-coded GMSK without iterations between the GMSK demodulator and LDGM decoder, and LDGM-coded GMSK with iterations between GMSK demodulator and LDGM decoder.
Figure 17:
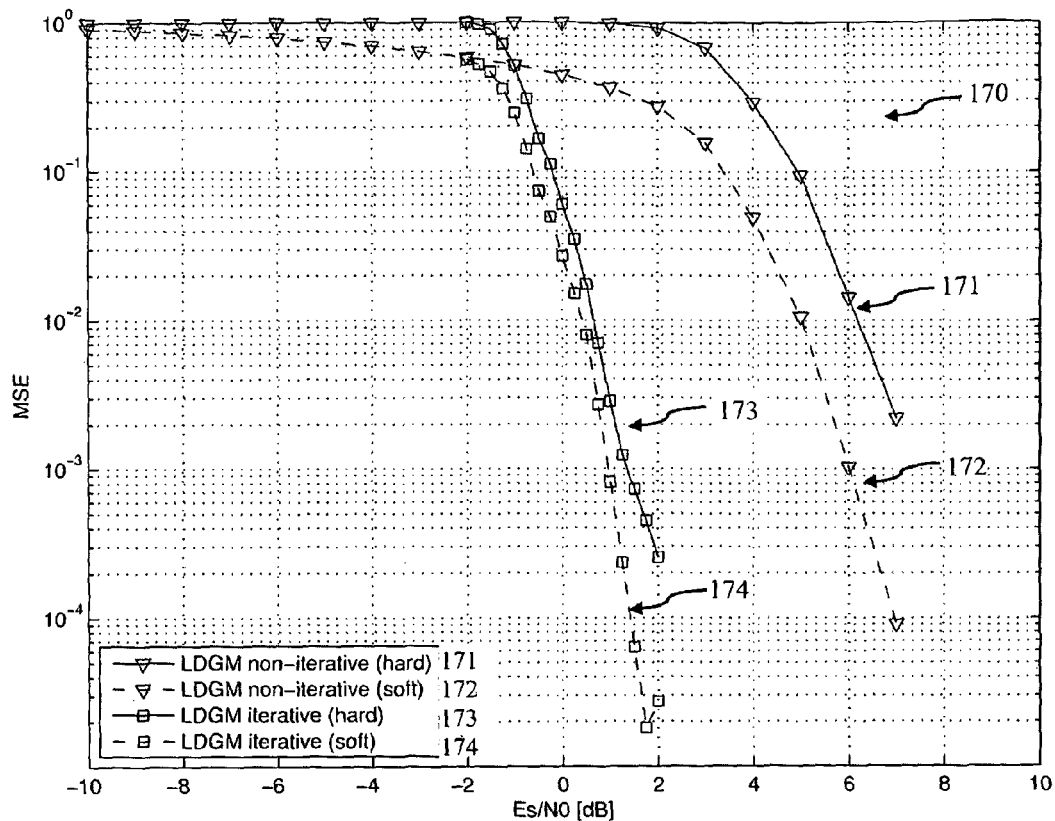
FIG. 17 is a figure comparing mean square error (MSE) between a transmitted LDGM/GMSK signal and a remodulated signal for various remodulation schemes including a non-iterative receiver (ie without iterations between the demodulator and decoder) which makes hard decisions or soft decisions on transmitted data bits, and an iterative receiver (ie with iterations between the demodulator and decoder) which makes hard decisions or soft decisions on transmitted data bits.

The performance of an embodiment of the LDGM-coded GMSK modulation will now be described. FIG. 16 is a plot 160 of the bit error rate (BER) for the transmitted data bits as a function of the signal-to-noise ratio, and FIG. 17 is a plot 170 the mean square error (MSE) between the transmitted signal and the remodulated signal as a function of the signal-to-noise ratio.

Consider GMSK with bandwidth-time product BT=0.4, and pulse length L=5 symbols and transmission over an AWGN channel with signal-to-noise ratio $E_s/N_0$. The LDGM code has rate ½ and its generator matrix is randomly constructed from an ensemble with degree polynomials $\lambda(z)=0.1z^1+0.1z^2+0.8z^7$ and $\rho(z)=0.1+0.2z+0.7z^2$. The LDGM code is decoded on the factor graph with 10 iterations per decoder activation. For the receiver with iterations between the GMSK demodulator and the LDGM decoder, we assume 10 iterations as well. Decoding is terminated if the estimated data bits at the decoder output fulfil a CRC. However, it is to be understood that this may be replaced by other termination criteria, for example based upon a maximum number of iterations, a likelihood value or change (or lack of) in a likelihood value or other parameter.

FIG. 16 compares the BER of the three systems. The first system is uncoded GMSK (ie no LDGM) which provides a reference level shown as the line with circles 161. The second system is LDGM-coded. GMSK without iterations between the demodulator and the decoder (referred to as "non-iterative" in the figures), shown as the line with triangles 162. That is, a hard estimate of the bits are provided to the decoder from the soft demodulator. This second system is a modification of the system shown in FIG. 4 (ie without iteration between LDGM Sof Decoder 25 and the Soft Demodulator 31). The third system is LDGM-coded GMSK with iterations between the demodulator and the decoder, shown as the line with squares 163. This last system illustrated the performance of the system shown in FIG. 4.

At a BER of $10^{-5}$, the coded system with iterations outperforms the uncoded system by over 8 dB. Further the non-iterative coded system still has a gain of about 3.5 dB over the uncoded system.

The benefits of soft remodulation versus hard remodulation are demonstrated in FIG. 17 and discussed below. We apply the MSE between the transmitted signal and the remodulated signal to measure the quality of the signal reconstruction. The following four remodulation schemes are considered.

In the first scheme, the receiver operates non-iteratively (ie without iterations between the demodulator and decoder) and makes hard decisions on the transmitted data bits. If the CRC is fulfilled, these hard decisions are encoded by the channel code and the code-word is fed to the GMSK modulator to reconstruct the transmitted signal. If the CRC fails, then typically a signal reconstructed based on these erroneous data bits does not have much in common with the original signal, therefore in this case, the reconstructed signal is simply set to be the all-zero signal, corresponding to no reconstruction, shown as line 171.

In the second scheme, the receiver operates non-iteratively, however, the soft remodulation method (including the GMSK soft signal reconstruction) is applied to reconstruct the transmitted signal, shown as line 172. That is the soft demodulator shown in FIGS. 5 and 6 that generates the soft estimate of the transmitted signal 31 is used.

In the third scheme the receiver operates iteratively (ie with iterations between the demodulator and the decoder, as is shown in FIG. 4). Otherwise the operation is the same as the first scheme, shown as line 173.

In the fourth scheme, the receiver operates iteratively and the soft remodulation method (including the GMSK soft signal reconstruction) is applied to reconstruct the transmitted signal, shown as line 174. That is the soft demodulator shown in FIGS. 5 and 6 that generates the soft estimate of the transmitted signal 31 is used.

For all four schemes, we reconstructed the signal based on hard decisions if the channel decoder indicated error free decoding (based on the CRC check), in which case the MSE is zero. The simulation results are shown in FIG. 17. As expected the systems perform in the order as listed above (171, 172, 173, 174), with the last one giving the best performance. In can also be seen that the soft signal reconstruction always outperforms the hard signal reconstruction.

For the iterative receivers, the soft remodulation has an MSE of about ½ at low SNR, while the hard remodulation has an MSE of about 1. This has a big effect in iterative multi-user decoding. While the soft remodulator decreases the interference by about 3 dB and thus starts the iterative process, the hard demodulator has no effect at all.

The performance of the overall system may be improved by optimising the degree polynomials of the LDGM code, the number of decoder iterations, and the number of iterations between the demodulator and the decoder for any given GMSK modulation.

Figure 18:
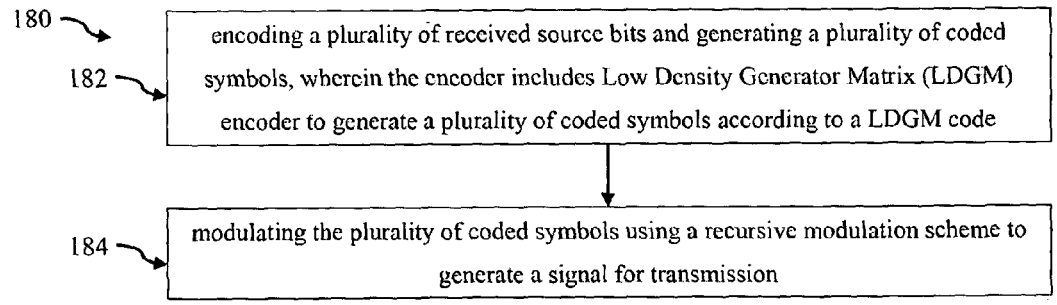
FIG. 18 is a flowchart of a method for generating a signal for transmission in a communication system using a recursive modulation scheme and a Low Density Generator Matrix (LDGM) code.

FIG. 18 is a flowchart of a method 180 for generating a signal for transmission in a communication system using a recursive modulation scheme and a Low Density Generator Matrix (LDGM) code. The method comprises:

encoding a plurality of received source bits and generating a plurality of coded symbols, wherein the encoder includes Low Density Generator Matrix (LDGM) encoder to generate a plurality of coded symbols according to a LDGM code (step 182); and modulating the plurality of coded symbols using a recursive modulation scheme to generate a signal for transmission (step 184).

Figure 19:
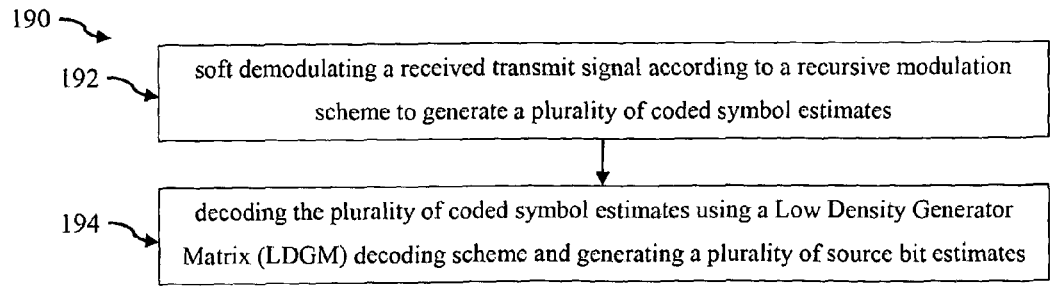
FIG. 19 is a flowchart of a method for receiving a transmission in a communication system using a recursive modulation scheme and a Low Density Generator Matrix (LDGM) code.

FIG. 19 is a flowchart of a method 190 for receiving a transmission in a communication system using a recursive modulation scheme and a Low Density Generator Matrix (LDGM) code. The method comprises:

soft demodulating a received transmit signal according to a recursive modulation scheme to generate a plurality of coded symbol estimates (192); and decoding the plurality of coded symbol estimates using a Low Density Generator Matrix (LDGM) decoding scheme and generating a plurality of source bit estimates (194).

The coded symbol estimates and source bit estimates may be hard or soft estimates. The soft demodulating and soft decoding may be performed iteratively until a stopping criterion is reached, wherein during each iteration, the soft demodulation is performed based upon a plurality of soft a-priori estimates of the coded symbol estimates received from the previous decoding step and are used to generate updated coded symbol estimates for use as soft a-priori estimates in the next iteration; and decoding the plurality of coded symbol estimates is performed based upon a plurality of soft a-priori coded symbol estimates received from the previous soft demodulation step and are used to generate updated code symbol estimates for transmission to the soft demodulator for use as a-priori coded symbol estimates in the next iteration.

These methods may be performed by relevant functional blocks within transmitter and receiver systems. For increased clarity and ease of discussion other common functional blocks have been omitted such as data sources, framing units, controllers/processors, memory units, CRC checkers, transmitter and receiver units which generate/receive the actual signal. For example a transmitter unit may process the modulation symbols in accordance with the design of the system and generates data samples and further conditions (eg, converts to analog, filters, amplifies, and frequency up-converts) the data samples to generate a modulated signal, which is transmitted via an antenna. Equivalent functions may be performed by the receiver. A controller or processor may be used to control the various functional blocks. It will also be understood that the methods described herein may be used for any digital communication system, whether wired or wireless, which is designed to use a Low Density Generator Matrix code with a recursive modulation scheme. Wireless systems may be RF based systems such as those operating in the UHF and VHF ranges. Wired systems may be cable or optical fibre systems. The various coding and modulation schemes may be implemented in hardware or circuits using one or more Field Programmable Gate Arrays (FPGA), Digital Signal Processors (DSP), or other appropriate hardware. The transmitters and receivers may further comprise other circuits or modules such as filters, equalisers, mixers, up-converters, down-converters, etc, for generating or processing signals including the transmit and receive signal.

Embodiments of a method and system for implementing a Low Density Generator Matrix code including an irregular repeat accumulate (IRA) code for use with recursive modulation schemes which has reduced complexity and thus reduced cost have been described herein. In one embodiment illustrated in FIG. 3, a combined accumulator and recursive modulator is used. In this embodiment, the transmitter comprises concatenation of a low density generator matrix code, followed by an accumulator and recursive modulation, and a corresponding receiver. This aspect eliminates the additional interleaver and combines the decoder for the accumulator and the soft demodulator in the receiver into a single joint decoder thereby reducing the number of components and complexity. In another embodiment, illustrated in FIG. 4, the transmitter is further simplified by eliminated the accumulator altogether and replacing it with a recursive modulator. That is the transmitter comprises serial concatenation of a low density generator matrix code with a recursive modulator. Similarly the receiver is simplified as only a soft demodulator is required prior to the LDGM soft decoder (compare FIG. 4 with FIG. 3).

The decoder/demodulator may be a component of a larger system. For example the methods and apparatus may be used in a multiple access system consisting of many users, each independently transmitting encoded and modulated data. In such scenarios, in addition to the decoded bits, a soft estimate of the transmitted signal can also be provided which can then be used to (iteratively) cancel interference to improve the performance of other users. Another application is turbo equalisation. A signal reconstruction could be achieved by taking a hard decision on the source bits and remodulating the result. However there are several problems with this approach. Firstly, if the decoded bit error rate is poor, we end up with a very bad estimate of the transmitted signal, which can increase, rather than decrease the amount of interference in an iterative interference cancellation application. Secondly, with recursive modulation such as differential modulation or CPM, a single bit error or erasure can lead to a completely incorrect signal estimate following that bit. Again, this catastrophically increases interference in a cancellation receiver. The methods and system described herein can also be further adapted to address these problems by reconstructing a soft signal estimate using all available information from the improved decoder described herein.

The methods and receivers may be utilised in communication systems and components such as those described in corresponding PCT Patent Application (number yet to be assigned) titled "Carrier phase and amplitude estimation for phase shift keying using pilots and data" filed on 13 Dec. 2013, and the following co-pending PCT patent applications:

PCT/AU2013/000888 titled "System and Method for Analog to Digital Conversion" filed on 13 Aug. 2013;

PCT/AU2013/000895 titled "Channel Allocation in a Communication. System" filed on 14 Aug. 2013;

PCT/AU2013/001078 titled "Communication system and method" filed on 20 Sep. 2013; and PCT/AU2013/001079 titled "Multi-Access Communication System" filed on 20 Sep. 2013. The content of each of these applications is hereby incorporated by reference in their entirety.

Those of skill in the art would understand that information and signals may be represented using any of a variety of technologies and techniques. For example, data, instructions, commands, information, signals, bits, symbols, and chips may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. For a hardware implementation, processing may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. A central processing unit (CPU) may be used, containing an Input/Output Interface, an Arithmetic and Logic Unit (ALU) and a Control Unit and Program Counter element which is in communication with input and output devices or modules through the Input/Output Interface, and a memory. Software modules, also known as computer programs, computer codes, or instructions, may contain a number of source code or object code segments or instructions, and may reside in any computer readable medium such as a RAM memory, flash memory, ROM memory, EPROM memory, registers, hard disk, a removable disk, a CD-ROM, a DVD-ROM or any other form of computer readable medium. In the alternative, the computer readable medium may be integral to the processor. The processor and the computer readable medium may reside in an ASIC or related device. The software codes may be stored in a memory unit and executed by a processor. The memory unit may be implemented within the processor or external to the processor, in which case it can be communicatively coupled to the processor via various means as is known in the art.

The reference to any prior art in this specification is not, and should not be taken as, an acknowledgement of any form of suggestion that such prior art forms part of the common general knowledge, or is well-known in the field.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

It will be appreciated by those skilled in the art that the invention is not restricted in its use to the particular application described. Neither is the present invention restricted in its preferred embodiment with regard to the particular elements and/or features described or depicted herein. It will be appreciated that the invention is not limited to the embodiment or embodiments disclosed, but is capable of numerous rearrangements, modifications and substitutions without departing from the scope of the invention.

The invention claimed is:

1. An apparatus for receiving a transmission in a communication system implementing a recursive modulation scheme and an Irregular Repeat Accumulate (IRA) code, the apparatus comprising:
    a soft demodulator comprising a joint recursive modulator and accumulator soft decoder for receiving a transmit signal and configured to demodulate the received signal using a trellis based algorithm using a joint trellis for the accumulator and recursive modulation scheme to generate a plurality of coded symbol estimates, wherein the soft demodulator does not include a de-interleaver to demodulate the received signal with the joint recursive modulator and accumulator soft decoder; and
    a Low Density Generator Matrix (LDGM) decoder for receiving the plurality of coded symbol estimates from the soft demodulator and decoding the coded symbol estimates to generate a plurality of source bit estimates.

2. The apparatus as claimed in claim 1, wherein iterative decoding of the received signal is implemented between the soft demodulator and the LDGM decoder until a stopping criterion is reached, wherein each iteration comprises the soft demodulator receives a plurality of soft a-priori estimates of the coded symbol estimates from the LDGM decoder, and generates updated coded symbol estimates which are transmitted to the LDGM decoder, and the LDGM decoder receives a plurality of soft a-priori coded symbol estimates from the soft demodulator and generates updated code symbol estimates which are transmitted to the soft demodulator for use as soft a-priori coded symbol estimates in the next iteration.

3. The apparatus as claimed in claim 2, wherein the communication system is a multi-access system or a turbo equalization system, and the soft demodulator is configured to generate a soft estimate of the transmitted signal.

4. The apparatus as claimed in claim 1, wherein the soft demodulator implements demodulation using a differential demodulation scheme.

5. The apparatus as claimed in claim 1, wherein the soft demodulator implements demodulation using a continuous phase demodulation scheme.

6. The apparatus as claimed in claim 1, wherein the soft demodulator correlates the received signal with all possible transmitted waveforms over a symbol period determined using the recursive modulation scheme.

7. The apparatus as claimed in claim 1, wherein the soft demodulator correlates the received signal with a set of approximations of the transmitted waveforms over a symbol period determined using the recursive modulation scheme.

8. A communication system comprising:
a transmitter further comprising:
an encoder for receiving a plurality of source bits and generating a plurality of coded symbols, wherein the encoder includes a Low Density Generator Matrix (LDGM) encoder to generate a plurality of coded symbols according to a LDGM code; and
a recursive modulator which receives the plurality of coded symbols from the encoder and modulates the received plurality of coded symbols to a signal for transmission using a recursive modulation scheme,
wherein the transmitter does not include an interleaver that interleaves the plurality of coded symbols between the encoder and the recursive modulator; and
a receiver comprising:
a soft demodulator comprising a joint recursive modulator and accumulator soft decoder for receiving a transmit signal and configured to demodulate the received signal using a trellis based algorithm using a joint trellis for the accumulator and recursive modulation scheme to generate a plurality of coded symbol estimates, wherein the soft demodulator does not include a de-interleaver to demodulate the received signal with the joint recursive modulator and accumulator soft decoder; and
a Low Density Generator Matrix (LDGM) decoder for receiving the plurality of coded symbol estimates from the soft demodulator and decoding the coded symbol estimates to generate a plurality of source bit estimates.

9. The system as claimed in claim 8, wherein the encoder is an irregular repeat accumulate (IRA) code encoder comprising the LDGM code concatenated with an accumulator and the plurality of coded symbols are encoded according to an IRA code.

10. A method comprising:
receiving, by a receiver, a transmission in a communication system using a recursive modulation scheme and a Low Density Generator Matrix (LDGM) code;
soft demodulating, using a soft demodulator, a received transmit signal according to a recursive modulation scheme to generate a plurality of coded symbol estimates, wherein the soft demodulator comprises a joint recursive modulator and accumulator soft decoder to demodulate the received signal using a trellis based algorithm using a joint trellis for the accumulator and recursive modulation scheme, wherein the soft demodulator does not include a de-interleaver to demodulate the received signal with the joint recursive modulator and accumulator soft decoder; and
decoding the plurality of coded symbol estimates using a Low Density Generator Matrix (LDGM) decoding scheme and generating a plurality of source bit estimates.

11. The method as claimed in claim 10 further comprising:
generating a signal for transmission in a communication system using a recursive modulation scheme and a Low Density Generator Matrix (LDGM) code;
encoding, using an encoder, a plurality of received source bits and generating a plurality of coded symbols, wherein the encoder includes Low Density Generator Matrix (LDGM) encoder to generate a plurality of coded symbols according to a LDGM code; and
modulating the plurality of coded symbols using a recursive modulation scheme to generate a signal for transmission.

12. The method as claimed in claim 11, wherein the encoding is performed using an irregular repeat accumulate code comprising an LDGM code concatenated with an accumulator.

13. The method as claimed in claim 10, wherein the steps of soft demodulating and decoding are performed iteratively until a stopping criterion is reached, wherein during each iteration, the soft demodulation is performed based upon a plurality of soft a-priori estimates of the coded symbol estimates received from the previous decoding step and are used to generate updated coded symbol estimates for use as soft a-priori estimates in the next iteration; and decoding the plurality of coded symbol estimates is performed based upon a plurality of soft a-priori coded symbol estimates received from the previous soft demodulation step and are used to generate updated code symbol estimates for transmission to the soft demodulator for use as a-priori coded symbol estimates in the next iteration.

14. The method as claimed in claim 10, wherein the communication system is a multi-access system or turbo-equalization system, and the soft demodulation step further generates a soft estimate of the transmitted signal.

15. The method as claimed in claim 10, wherein the soft demodulation step implements a differential demodulation scheme.

16. The method as claimed in claim 10, wherein the soft demodulation step implements a continuous phase demodulation scheme.

17. The method as claimed in claim 10, wherein the soft demodulation step is performed by correlating the received signal with all possible transmitted waveforms over a symbol period determined using the recursive modulation scheme.

18. The method as claimed in claim 10, wherein the soft demodulator correlates the received signal with a set of approximations of the transmitted waveforms over a symbol period determined using the recursive modulation scheme.

* * * * *